United States Patent
Blyth

(10) Patent No.: US 6,421,213 B1
(45) Date of Patent: Jul. 16, 2002

(54) METHOD AND APPARATUS FOR DETECTING A TAMPER CONDITION AND ISOLATING A CIRCUIT THEREFROM

(75) Inventor: Trevor A. Blyth, Sandy, UT (US)

(73) Assignee: Advanced Technology Materials, Inc., Danbury, CT (US)

(*) Notice: Subject to any disclaimer, the term of this patent is extended or adjusted under 35 U.S.C. 154(b) by 0 days.

(21) Appl. No.: 09/531,131

(22) Filed: Mar. 17, 2000

(51) Int. Cl.[7] .............................................. H02H 3/100
(52) U.S. Cl. ........................................................... 361/1
(58) Field of Search ................................ 361/1, 56, 86

(56) References Cited

U.S. PATENT DOCUMENTS

| | | | | | |
|---|---|---|---|---|---|
| 5,309,387 A | * | 5/1994 | Mori | ............................. | 365/52 |
| 5,345,225 A | * | 9/1994 | Davis | ............................. | 307/38 |
| 5,956,408 A | * | 9/1999 | Arnold | ............................. | 713/189 |
| 6,127,745 A | * | 10/2000 | Bolz | ............................. | 361/84 |

* cited by examiner

Primary Examiner—Edward H. Tso
Assistant Examiner—Pia Tibbits
(74) Attorney, Agent, or Firm—Oliver A. Zitzmann; Margaret Chappuis; Steven J. Hultquist

(57) ABSTRACT

A system is disclosed for isolating a bond pad from the rest of the circuitry of a semiconductor chip in a manner that protects the chip from applied signals that are outside the normal operating range and which tamper with the operation of the system. The system includes the use of a controllable switch for routing the signal from the bond pad to the circuit and a detector for detecting a tamper condition on the bond pad. The detection of a tamper condition causes the detector to inform the microcontroller on the chip to, for example, terminate the operation in progress, perform a controlled system shutdown, disable pre-arranged functions, or record the fact that a tamper condition occurred.

34 Claims, 5 Drawing Sheets

METHOD AND APPARATUS FOR DETECTING A TAMPER CONDITION AND ISOLATING A CIRCUIT THEREFROM

FIELD OF THE INVENTION

The present invention relates in general to electronic circuitry, and more specifically to a chip that can detect a tamper voltage and prevent that voltage from corrupting the other circuitry on the chip.

BACKGROUND OF THE INVENTION

Electrical signals are typically routed to and from a semiconductor chip or integrated circuit through bond pads. These bond pads are typically formed of aluminum pads that are electrically connected to the external pins on the chip's package by thin gold bond wires.

Most of the bond pads on a chip are typically used during the normal operation of the chip by the end user. However, a manufacturer may include "test pads" that may be used by it to facilitate testing of the chip. For example, and referring to FIG. 1, some flash EPROM (erasable-programmable-read-only-memory) chips contain a "Vpp" test pad 2 whereby a voltage (i.e., Vpp) can be directly routed to a Flash EPROM memory array 4 in order to perform certain tests. The Vpp voltage is typically a relatively high voltage which is generated internally on the chip by a Vpp generator 6, as shown in FIG. 1. As one of skill in the art of Flash EPROM design will recognize, Vpp generator 6 is typically a "charge pump" circuit which is capable of boosting Vpp to a voltage higher than the normal voltage levels used elsewhere on the chip. The high Vpp voltage (typically 12 Volts) is used by the Flash EPROM during the programming (i.e., writing) and erase operations. However, because the magnitude of Vpp generated by Vpp generator 6 can be difficult to control, or because it may be desirable to bypass the internal generation of Vpp, it is sometimes desirable during testing to externally route Vpp into the memory array 4 from Vpp test pad 2. The manufacturer of the chip can then use Vpp test pad 2 to provide a wider range of signals to memory array 4, with such signals being particularly useful in assessing the quality and reliability of the chip before sale to a prospective purchaser.

It is typical for the manufacturer to disconnect (i.e., open circuit) a test pad after testing has finished and before the chip is sent to the purchaser or end user, for example, at location 8 in FIG. 1. In a Flash EPROM chip this disconnection of the Vpp test bond pad is necessary to ensure that the customer or other end user does not tamper with the Vpp voltage and disturb the data state of the memory array. For example, it is important to disconnect the Vpp test pad in Flash EPROM chips that are used in solid state debit cards so that the user will be unable to disturb the data within the cards in a manner which would reflect a higher credit balance than the user actually has.

Test bond pads have been disconnected in the prior art in at least three ways. First, a trace which carries signals to and from the test pad can be ablated by using a laser or a particle beam. Typically, the laser or particle beam is directed to a target area on the trace with sufficient energy to remove the trace in that location. Second, the test pad can be made to incorporate a fuse or antifuse which, when exposed to high current or voltage, will create a short circuit or open circuit respectively. Depending on the location of the fuse or antifuse with respect to the test pad, the test pad can be electrically disconnected from the circuitry on the chip. However, these prior art techniques for disconnecting a test pad suffer from several drawbacks. Both the ablation/fusing techniques may not result in a perfect open circuit and instead may leave some amount of residual conductive material between the test pad and the circuitry. The resulting resistive path may, in the case of a Flash EPROM, allow the user to tamper with the Vpp voltage and thus corrupt data. Also, these prior art techniques, being destructive in nature, may cause other unwanted damage to the chip. Moreover, the creation of a target area or the fuse/antifuse may involve the use of extra processing or testing steps during the manufacture of the chip, adding extra cost and complexity.

A third way of disconnecting a test bond pad from other circuitry on a chip is to use a transistor as a switch to controllably allow signals to pass to and from the test bond pad. If the test bond pad is to be used during a special test mode, a signal will be sent to the gate of the transistor to turn it on and thereby connect the test pad to the rest of the circuitry under test. While the use of a transistor avoids the disadvantages associated with ablation or fusing, it is susceptible to tampering by the application of voltages at the test pad that are beyond the normal operating limits of the transistor. For example, an usually high voltage may damage the transistor, allowing it to be bypassed. Also, an usually low voltage, and perhaps even a negative voltage, could cause the transistor to conduct despite the lack of a gate signal, again bypassing the transistor. In either circumstance, the result, in a Flash EPROM, could be the possible corruption of data due to intentional tampering.

Given these drawbacks of the prior art, it would be desirable to effectively disconnect a test pad such as the Vpp test pad of a Flash EPROM in such a manner to prevent a tamper condition from corrupting the data within the chip.

SUMMARY OF THE INVENTION

According to one embodiment of the invention, a system is disclosed for isolating a bond pad from the rest of the circuitry of a semiconductor chip in a manner that protects the chip from applied signals that are outside the normal operating range and which tamper with the operation of the system. The system includes the use of a controllable switch for routing the signal from the bond pad to the circuit and a detector for detecting a tamper condition on the bond pad. The detection of a tamper condition causes the detector to inform the microcontroller on the chip to, for example, terminate the operation in progress, perform a controlled system shutdown, disable pre-arranged functions, or record the fact that a tamper condition occurred.

BRIEF DESCRIPTION OF THE DRAWINGS

The foregoing and other advantages of the invention will become apparent upon reading the following detailed description and upon reference to the drawings in which.

DESCRIPTION OF ILLUSTRATIVE EMBODIMENTS

The disclosed embodiment was specifically developed to detect whether a tamper condition exists on the Vpp test pad of a Flash EPROM chip, and particularly whether an unacceptably low Vpp voltage is present at the Vpp test pad. However, one of skill in the art of chip design will recognize that use of the disclosed technique is not so limited, and could be applied to a variety of situations and chip products. Importantly, the disclosed technique is not limited to the detection of tamper conditions on test pads, but could be applied to the detection of tamper conditions on normal pads as well. Also, the disclosed technique may be used to detect a tamper condition at any node in an electrical schematic, and need not be limited to the detection of tamper conditions at bond pads on integrated circuits. "Tamper condition" as used herein refers to any condition that exceeds specified normal limits, such as an overvoltage, undervoltage, overcurrent, or undercurrent condition, regardless of any intent by the user in generating such a condition.

Figure 2:
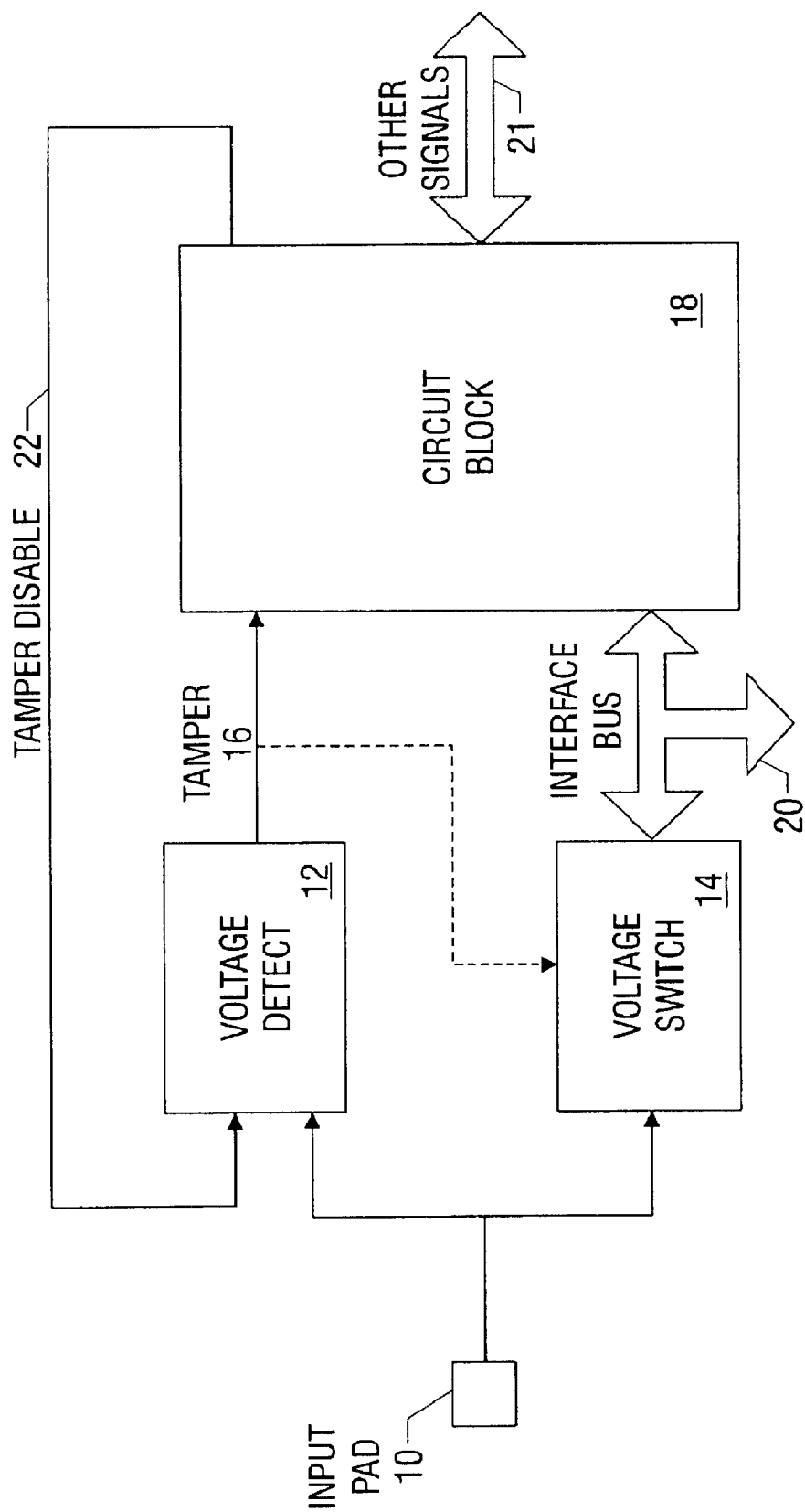
FIG. 2 shows a block diagram of an embodiment of a tamper detect system built in accordance with the present invention.

FIG. 2 shows a block diagram of the system of one embodiment of the invention. An input pad 10, such as the Vpp test pad on a Flash EPROM, is input to a voltage detect block 12 and to a voltage switch block 14. (The input pad 10 may also constitute an input/output pad). In the disclosed embodiment, the voltage detect block 12 is used to detect an unacceptably low voltage on input pad 10, and to generate a tamper signal 16 when such a low voltage is detected. The detection of an unacceptably low Vpp is of special concern in Flash EPROMs because the application of a low Vpp at the Vpp test pad may interfere with the internal generation of Vpp and affect the writing and/or erasure of the memory array. This tamper signal 16 is sent to circuit block 18, which could be a complete Flash EPROM circuit, an embedded Flash EPROM circuit, or any other useful circuit or combination of circuits. Upon receipt of tamper signal 16, circuit block 18 reacts by, for example, terminating the operation in progress (e.g., writing or erasing), performing a controlled system shutdown, disabling pre-arranged functions, or recording the fact that a tamper condition occurred. In this manner, circuit block 18 is protected from the application of a voltage on the input pad 10 that is too low.

Many variations on this basic disclosure are possible without departing from the basic spirit of the invention. For example, voltage detect block 12 could be a circuit which detects an unacceptably high voltage in order to protect circuit block 18 from an overvoltage condition. Optimally, such a high voltage detect block could be used in parallel with low voltage detect block 12 so that two tamper signals (a "tamper high" and a "tamper low") could be generated and passed on to circuit block 18. Additionally, voltage detect block 12 could be a circuit which detects either an unacceptably high or low current to protect circuit block 18 against receiving a poor level of current from input pad 10. Suitable detector circuits for performing these functions are well known to those skilled in the art of circuit design, but are not particularly pertinent to the Flash EPROM chips which influenced the present disclosure. Accordingly, such alternative voltage detect circuits are not disclosed herein.

Furthermore, and as shown in FIG. 2, the basic system could be altered so that tamper signal 16 is input directly into the voltage switch block 14, perhaps in addition to feeding the tamper signal 16 into circuit block 18 as shown. In addition, the circuit block 18, depending on its current state of operation, could be made to generate a tamper disable signal 22 which is fed into voltage detect block 12 to temporarily disable the voltage detection capabilities of the disclosed system. Of course, circuit block 18 will have other signals 21 connected to it, some of which will come from outside the chip.

Figure 3:
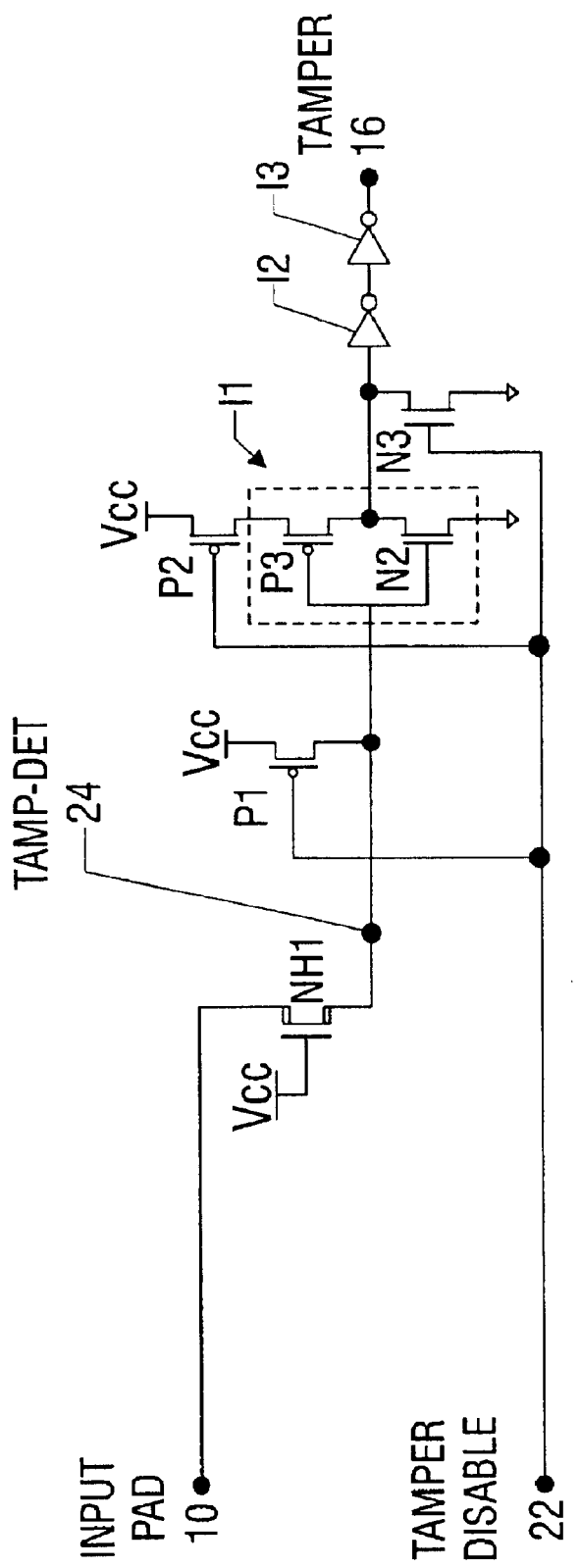
FIG. 3 shows the circuitry of the voltage detect block.

A circuit capable of performing the function of voltage detect block 12 is shown in FIG. 3. In this circuit diagram, regular complementary metal-oxide-semiconductor (CMOS) logic transistors are labeled as Nx or Px and denote N-channel and P-channel transistors respectively. The transistor labeled NH1 is a high voltage transistor that contains modified diffusion regions junctions) which can withstand the application of high voltages (such as Vpp) without breaking down. In the process used to first manufacture the preferred embodiment, NHx transistors have lower thresholds, thicker gate oxides and larger minimum dimensions compared to the regular CMOS logic transistors. Transistors with different features, as found in other manufacturing processes, can also be used without departing from the basic spirit of the invention. In this embodiment, voltage detect block 12 contains three inverters, I1, I2, and I3, one pull-up transistor P1, two disable transistors P2 and N3, and a pass transistor NH1. In normal operation the voltage on tamper disable 22 is low and pull-up transistor P1 attempts to connect tamp_det 24 to Vcc. During testing, input pad 10 is connected to an external supply at a voltage between Vcc and a maximum of about 17 volts. The voltage on input pad 10 is greater than Vcc−Vt(NH1); therefore pass transistor NH1 does not conduct and tamp_det 24 remains at a voltage equal to Vcc. After manufacturing and testing is complete and when the circuit is operating in its final point of use, the input pad 10 should be unconnected thus allowing the drain of pass transistor NH1 to float. Under these conditions the voltage on tamp_det 24 is also equal to Vcc. However, if an external connection is made to input pad 10 and a voltage is applied which is less than Vcc−Vt(NH1) then NH1 conducts and the voltage on tamp_det 24 is reduced. The relative transistor dimensions of NH1 and P1 are chosen such that, once NH1 starts to conduct, the voltage drop across NH1 is minimized to a few tens of millivolts so that the voltage on tamp_det 24 closely follows the voltage on input pad 10.

Tamp_det 24 is then presented to inverter I1. If tamp_det 24 is lower than the threshold voltage of inverter I1 (i.e., Vt(I1)), then the output of I1 will be a high voltage, and tamper signal 16 (emerging from buffering inverters I2 and I3) will be high, signaling that a tamper condition (i.e., an unacceptably low voltage) has been detected on input pad 10. If tamp_det 24 is greater than Vt(I1), then tamper signal 16 will be low, signaling that the voltage on input pad 10 is sufficiently high such that no tamper condition exists. To summarize, voltage detect block 12 generates tamper signal 16 when the voltage on input pad 10 is less than Vt(I1). One skilled in the art will recognize that Vt(I1) can be adjusted to set an appropriate value by adjusting either the relative lengths or widths of transistors N2 and P3, or by modifying their threshold voltage values.

Although not strictly necessary to the operation of the invention in a broad sense, a tamper disable signal 22 can be sent from circuit block 18 to voltage detect block 12. When tamper disable signal 22 is high, N3 pulls the output of inverter I1 and consequently tamper signal 16 to ground, regardless of the voltage of input pad 10. In this way, the voltage detect function of voltage detect block 12 can be temporarily disabled if circuit block 18 determines that the voltage detect function is not needed or desired for some reason.

Figure 1:
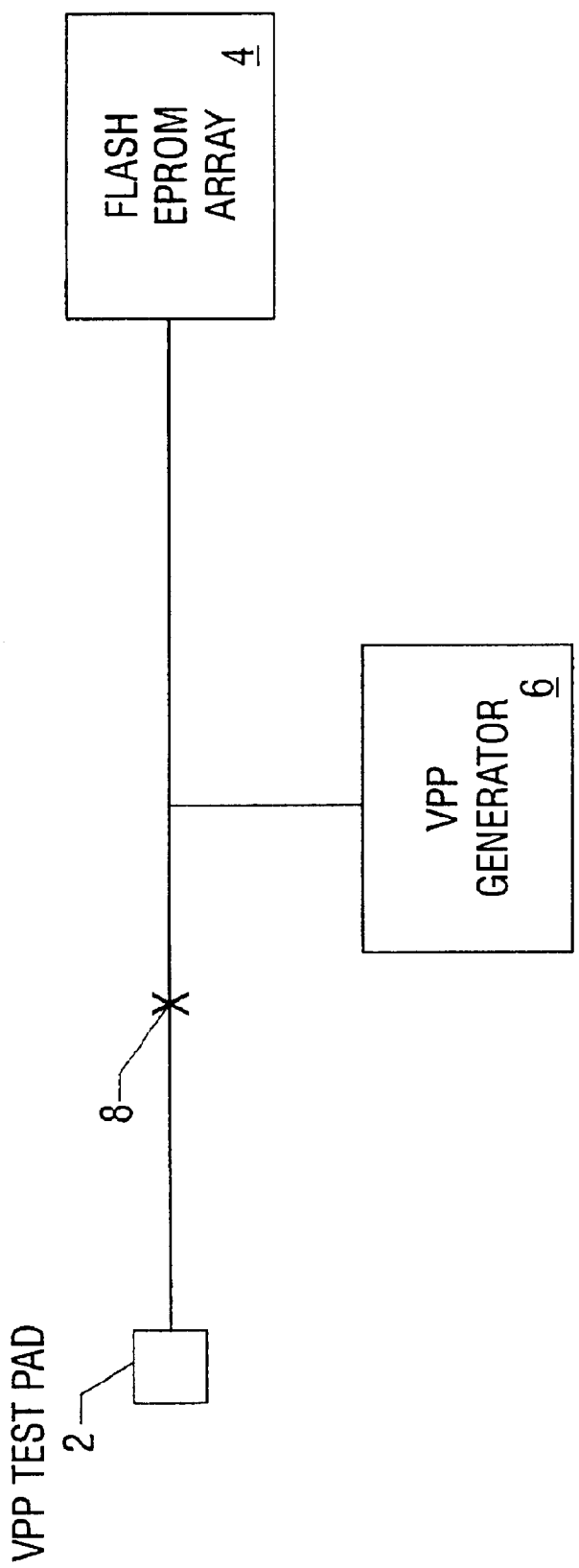
FIG. 1 shows the manufactured connection of a Vpp test bond pad to a Flash EPROM memory array.
Figure 4:
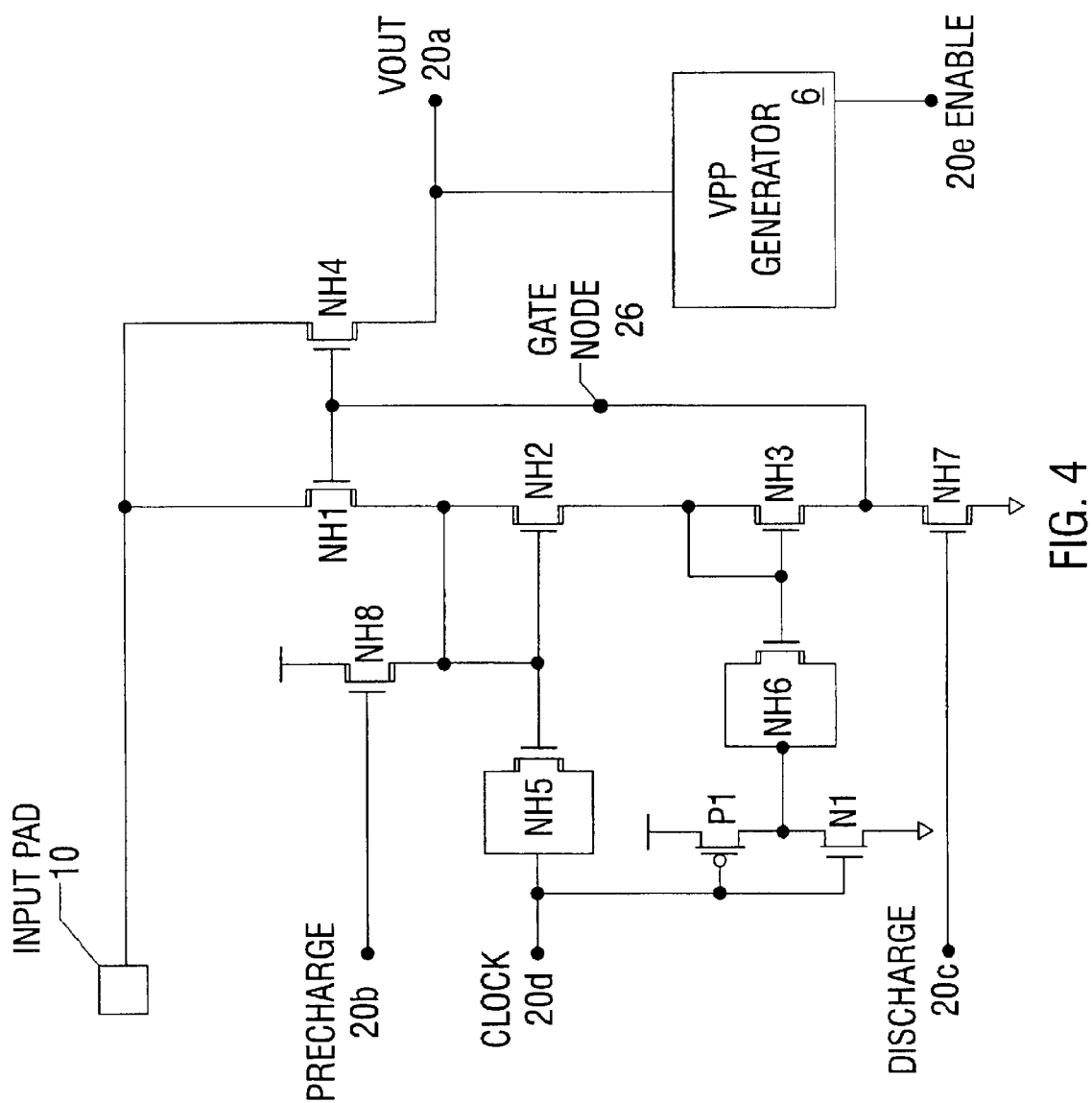
FIG. 4 shows the circuitry of the voltage switch block.

A circuit capable of performing the function of voltage switch block 14 is shown in FIG. 4. As in the prior art diagram shown in FIG. 1, the Vpp generator 6 is connected to the correct node in the circuit, Vout 20a, which carries the Vpp signal to circuit block 18 through interface bus 20. (All signals labeled as "20x" are signals present within the interface bus 20). During normal operation of the chip, the logic circuitry within the circuit block 18 enables the Vpp generator 6 which then sends an internally-generated Vpp signal to Vout 20*a*.

Generally, the voltage switch block 14, when activated, acts to pass the voltage at input pad 10 to the circuit block 18 via Vout signal 20*a*. This is accomplished as follows. First, the logic circuitry within circuit block 18 passes signals precharge 20*b*, discharge 20*c*, and clock 20*d* to the voltage switch block through the interface bus 20. If circuit block 18 wishes to enable the switch, it sends the following signals on the interface bus 20: precharge 20*b*=high logic, discharge 20*c*=low logic, and clock 20*d* is clocked between high and low. Because this combination of logic on the interface bus 20 typically signifies that the device is operating in a special test mode, the Vpp generator 6 is typically disabled at signal 20*e* as well. When these signals appear at their respective nodes in FIG. 3, the combined effect is to "charge pump" the value of gate node 26 to a voltage which is approximately 2(Vcc−Vt) above the voltage on input pad 10. Since 2(Vcc−Vt) is greater than Vt(NH4), NH4 can pass the voltage on input pad 10 to the circuit block 18 through Vout 20*a* without an appreciable voltage drop across NH4, as is well known in the art.

By contrast, the voltage switch block 14 can be disabled by sending the following signal over the interface bus 20: precharge 20*b*=low logic, discharge 20*c*=high, clock 20*d*= don't care. When this happens, gate node 26 is pulled to ground through NH7, and transistor NH4 is off. Thus, input pad 10 is isolated from Vout and is not connected to circuit block 18.

As noted in the background section, transistor-based switches such as voltage switch block 14 are susceptible to being by-passed by the application of voltages outside the normal voltage operating range. For instance, an external negative voltage applied to input pad 10 may cause NH4 to conduct even if its gate node is at Vss. The negative voltage on the drain of NH4 creates a positive gate-to-source voltage and also creates a negative back-bias effect, which reduces the threshold of NH4. Thus the channel of NH4 may become conducting due to channel inversion and the voltage at the output of Vpp generator 6 on node Vout 20*a* would be disturbed. NH4 is a high voltage n-channel transistor, so chosen to facilitate the switching of high voltages connected to the input pad 20. Typically, such transistors have fairly low thresholds and, due to the threshold reduction caused by back-bias, NH4 may conduct with a negative voltage as small as 0.3V applied to input pad 10. Another mechanism for disturbing Vout 20*a* is the bipolar transistor action that occurs when a negative applied voltage causes the drain of NH4 to become a forward biased emitter. Bipolar action begins at an applied voltage of about −0.6V on the drain of NH4. Under either of the above circumstances, a low impedance load is applied to the output of Vpp Generator 6 such that Vpp generator 6 is unable to supply the high voltages required by circuit block 18.

Figure 5:
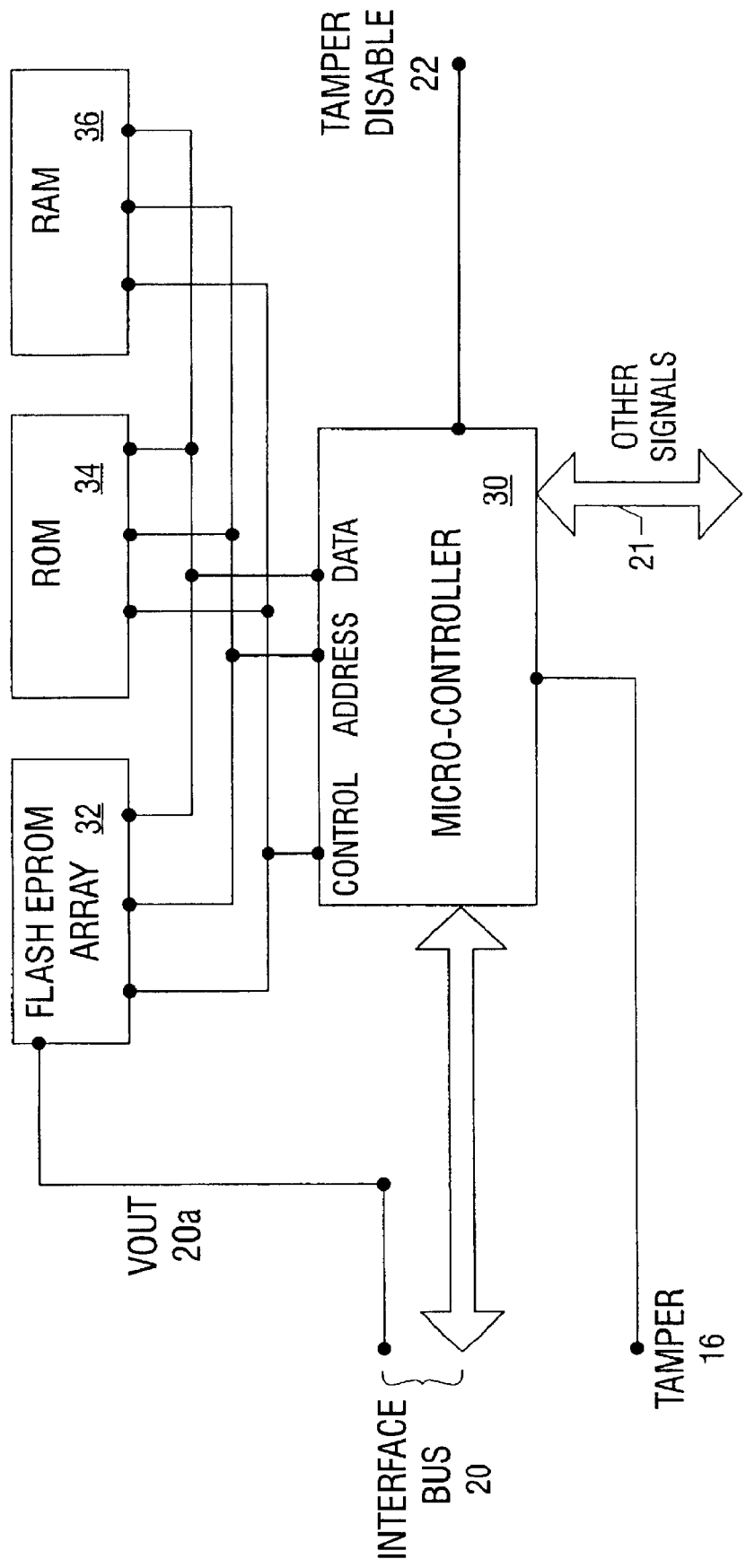
FIG. 5 shows the circuitry of the circuit block, including the microcontroller.

The application of a negative voltage on input pad 10 would, however, result in the generation of tamper signal 16 from the voltage detect block 12 as previously discussed. This tamper signal is picked up by circuit block 18, which is shown in further detail in FIG. 5. The circuit block 18 is comprised, in a Flash EPROM embodiment, of a microcontroller 30, a Flash EPROM array 32, and read-only memory (ROM) 34, and random-access-memory (RAM) 36. (The ROM 34 and RAM 36 are primarily used by the microcontroller 30.) When the tamper signal 16 is received by microcontroller 30, the microcontroller 30 treats the signal as an interrupt and immediately and preferably enters a state which aborts any writing or erasing which may be occurring in the Flash EPROM array 32. While one skilled in the art will understand how to configure a microcontroller to so function without undue experimentation, a brief description is provided. When the tamper signal is asserted it is recognized almost immediately, during a single microcontroller clock cycle. The current instruction being processed by the microcontroller is completed and the program counter is pushed onto a stack. The program counter is then loaded with a predetermined content that initiates the servicing of the interrupt. Control of the microcontroller is then withdrawn from the application program that was running at the time of the interrupt (e.g., writing or erasing) and is given to a secure process that protects data and disables control from external inputs. Depending on the instruction that was executing at the time of the interrupt, microcontroller control is given to the secure process within a few tens of clock cycles. This time delay is typically less than a few microseconds, which is a short time period compared to the time required to write or erase data in Flash EPROM array 32. In other words, the interruption of the writing or erasing program will take place in a quick enough fashion that the data in the Flash EPROM array 32 will not be corrupted.

The microcontroller 30 can also be programmed to react in other ways. For example, the microcontroller 30 can, upon the detection of tamper signal 16, perform a controlled system shutdown, disable pre-arranged functions, or record the fact that a tamper condition occurred. As with the program termination mode of operation outlined in the preceding paragraph, the actual details of how to program the microcontroller 30 to perform such functions is well known to those of skill in the art of circuit design and would not involve undue experimentation.

From the foregoing detailed description of a specific embodiment of the invention, it should be apparent that a way of protecting a circuit from a tamper condition has been disclosed. Although specific embodiments of the invention have been disclosed herein in some detail, this has been done solely for the purposes of illustrating various aspects and features of the invention, and is not intended to be limiting with respect to the scope of the invention. It is contemplated that various substitutions, alterations, and/or modifications, including but not limited to those design alternatives which might have been specifically noted in this disclosure, may be made to the disclosed embodiment without departing from the spirit and scope of the invention as defined in the appended claims.

What is claimed is:

1. A method for protecting a circuit of a semiconductor chip from the application of a primary signal, the primary signal being defined by parameters, the circuit being isolated from the primary signal by isolating a bond pad from the circuit with a switch, comprising:

supplying the primary signal to a detector and to the switch;

disabling the switch to interrupt the primary signal from being applied to the circuit; and generating a tamper signal at the detector if at least one of the primary signal parameters is greater than or less than a value set by the detector.

2. The method of claim 1, wherein the circuit includes a Flash EPROM.

3. The method of claim 1, wherein one of the parameters of the primary signal is the voltage of the primary signal, and the detector is a voltage detector.

4. The method of claim 3, wherein the tamper signal is generated if the voltage of the primary signal is less than a value set by the voltage detector.

5. The method of claim 1, wherein one of the parameters of the primary signal is the current of the signal, and the detector is a current detector.

6. The method of claim 1, wherein the primary signal is applied to a bond pad of an integrated circuit device.

7. The method of claim 6, wherein the bond pad is the Vpp test pad of an integrated circuit containing a Flash EPROM memory array.

8. The method of claim 1, further comprising sending the tamper signal to a logic circuit.

9. The method of claim 8, wherein the circuit performs operations and wherein the logic circuit terminates the circuit operation in progress.

10. The method of claim 8, wherein the logic circuit performs a system shutdown.

11. The method of claim 8, wherein the logic circuit records the fact that a tamper condition occurred.

12. The method of claim 1, wherein the switch includes a transistor.

13. The method of claim 1, wherein the switch is activated by a charge pumping circuit.

14. An apparatus for protecting a circuit on a semiconductor chip from the application of a primary signal, the primary signal being defined by parameters, comprising:
   a detector, wherein the primary signal is input to the detector, and wherein the detector generates
      a tamper signal if at least one of the primary signal parameters is greater than or less than
      a value set by the detector;
   a switch interposed between the primary signal and the circuit; and
   a logic circuit responsive to the tamper signal.

15. The apparatus of claim 14, wherein the circuit includes a Flash EPROM.

16. The apparatus of claim 14, wherein one of the parameters of the primary signal is the voltage of the primary signal, and the detector is a voltage detector.

17. The apparatus of claim 16, wherein the tamper signal is generated if the voltage of the primary signal is less than a value set by the voltage detector.

18. The apparatus of claim 14, wherein one of the parameters of the primary signal is the current of the signal, and the detector is a current detector.

19. The apparatus of claim 14, wherein the primary signal is applied to a bond pad of an integrated circuit device.

20. The apparatus of claim 19, wherein the bond pad is the Vpp test pad of an integrated circuit containing a Flash EPROM memory array.

21. The apparatus of claim 14, wherein the circuit performs operations and wherein the logic circuit terminates the circuit operation in progress in response to the tamper signal.

22. The apparatus of claim 14, wherein the logic circuit performs a system shutdown in response to the tamper signal.

23. The apparatus of claim 14, wherein the logic circuit records the fact that a tamper condition occurred in response to the tamper signal.

24. The apparatus of claim 14, wherein the switch includes a transistor.

25. The apparatus of claim 14, wherein the switch is activated by a charge pumping circuit.

26. An apparatus for protecting a circuit from the application of a primary signal, the primary signal being defined by parameters, comprising;
   means for generating a tamper signal in response to the primary signal;
   a switch interposed between the primary signal and the circuit; and
   a logic circuit responsive to the tamper signal.

27. The apparatus of claim 26, wherein the circuit includes a Flash EPROM.

28. The apparatus of claim 26, wherein the primary signal is applied to a bond pad of an integrated circuit device.

29. The apparatus of claim 28, wherein the bond pad is the Vpp test pad of an integrated circuit containing a Flash EPROM memory array.

30. The apparatus of claim 26, wherein the circuit performs operations and wherein the logic circuit terminates the circuit operation in progress in response to the tamper signal.

31. The apparatus of claim 26, wherein the logic circuit performs a system shutdown in response to the tamper signal.

32. The apparatus of claim 26, wherein the logic circuit records the fact that a tamper condition occurred in response to the tamper signal.

33. The apparatus of claim 26, wherein the switch includes a transistor.

34. The apparatus of claim 26, wherein the switch is activated by a charge pumping circuit.

* * * * *